(12) United States Patent
Torii et al.

(10) Patent No.: US 7,602,564 B2
(45) Date of Patent: Oct. 13, 2009

(54) OPTICAL ELEMENT HOLDING APPARATUS

(75) Inventors: Hirotoshi Torii, Utsunomiya (JP); Kouhei Imoto, Saitama (JP)

(73) Assignee: Canon Kabushiki Kaisha, Tokyo (JP)

(*) Notice: Subject to any disclaimer, the term of this patent is extended or adjusted under 35 U.S.C. 154(b) by 71 days.

(21) Appl. No.: 12/042,210

(22) Filed: Mar. 4, 2008

(65) Prior Publication Data
US 2008/0218883 A1 Sep. 11, 2008

(30) Foreign Application Priority Data
Mar. 5, 2007 (JP) ............................. 2007-054105

(51) Int. Cl.
*G02B 7/02* (2006.01)
(52) U.S. Cl. .................. 359/822; 359/811; 359/819; 359/820; 359/198; 356/614; 355/4; 369/44.14
(58) Field of Classification Search ................ 359/811, 359/813, 814, 819, 820, 822, 196; 356/4.01, 356/5.01, 139.1, 614; 355/53, 56, 72–75; 369/44.11–44.16; 248/180.1, 472, 565, 573, 248/621, 638; 396/55
See application file for complete search history.

(56) References Cited

U.S. PATENT DOCUMENTS

| | | | | |
|---|---|---|---|---|
| 4,763,991 | A * | 8/1988 | Klotz, Jr. ..................... | 359/896 |
| 5,313,333 | A * | 5/1994 | O'Brien et al. ............. | 359/820 |
| 5,383,168 | A * | 1/1995 | O'Brien et al. ........... | 369/44.14 |
| 6,400,516 | B1 * | 6/2002 | Spinali ....................... | 359/819 |
| 6,853,443 | B2 * | 2/2005 | Nishi .......................... | 355/72 |
| 6,867,848 | B2 * | 3/2005 | Ebinuma et al. .............. | 355/75 |
| 6,870,632 | B2 | 3/2005 | Petasch | |
| 7,085,080 | B2 * | 8/2006 | Schaffer et al. ............. | 359/819 |
| 7,113,263 | B2 * | 9/2006 | Ebinuma et al. .............. | 355/75 |
| 7,218,462 | B2 * | 5/2007 | Sudoh ......................... | 359/811 |
| 7,268,464 | B2 * | 9/2007 | Kishi .................... | 310/323.02 |
| 7,471,469 | B2 * | 12/2008 | Sorg et al. .................. | 359/811 |

FOREIGN PATENT DOCUMENTS

JP 2002-350699 12/2002

\* cited by examiner

*Primary Examiner*—Loha Ben
(74) *Attorney, Agent, or Firm*—Canon USA, Inc IP Div

(57) ABSTRACT

A holding apparatus that holds an optical element above a base includes three holding units provided at different positions along an outer periphery of the optical element. Each holding unit includes a first member provided on the optical element, a second member provided on the base, a columnar third member extending in a direction perpendicular to both a tangential direction and a radial direction of the optical element, and a plate-shaped fourth member having a thickness in the radial direction of the optical element. The first member and the second member are connected to each other with the third member and the fourth member disposed therebetween.

8 Claims, 11 Drawing Sheets

OPTICAL ELEMENT HOLDING APPARATUS

BACKGROUND OF THE INVENTION

1. Field of the Invention

The present invention relates to optical element holding apparatuses for holding optical elements, and more particularly, to an optical element holding apparatus for holding an optical element included in a projection optical system of an exposure apparatus.

2. Description of the Related Art

Reduction projection exposure apparatuses are generally used to transfer a circuit pattern formed on a mask onto a wafer or the like using a projection optical system in a manufacturing process of a micro device using a photolithographic technique.

The resolution of exposure depends on a wavelength of exposure light and a numerical aperture (NA) of the projection optical system. The resolution is increased as the wavelength is reduced and the numerical aperture is increased.

Therefore, recently, to comply with the demands for miniaturization of semiconductor devices, the wavelength of exposure light has been reduced. More specifically, the wavelength of the exposure light has been reduced in the order of extra-high pressure mercury lamp (i-line (wavelength is about 365 nm)), KrF excimer laser (wavelength is about 248 nm), and ArF excimer laser (wavelength is about 193 nm).

However, there is a limit to the miniaturization of semiconductor devices that can be achieved by lithography techniques using the above-described ultraviolet exposure light. Accordingly, to transfer an extremely fine circuit pattern of 0.1 μm or less with high resolution, a reduction projection exposure apparatus (hereinafter referred to as "EUV exposure apparatus") using extreme ultraviolet (EUV) light having a wavelength of abut 10 nm to 15 nm, which is smaller than the wavelength of ultraviolet light, has been developed.

In the EUV exposure apparatus that performs exposure with high resolution, the projection optical system is required to have an extremely high accuracy. In addition, holding apparatuses are required to have sufficiently high natural frequencies.

FIG. 13 illustrates a holding apparatus described in Japanese Patent Laid-Open No. 2002-350699 (corresponding to U.S. Pat. No. 6,870,632). The holding apparatus holds an optical element 1 and includes three supporting devices 2 placed at three positions along the periphery of the optical element 1. Each of the supporting devices 2 includes bending members 7 and 9 disposed along the tangential direction with respect to the optical element 1 and a bending member 11 extending in a radial direction. The bending members 7, 9, and 11 are connected to the optical element 1 by an attachment portion 4, and are connected to a base structure 3 by a connecting portion 6. The bending members 7 and 9 are connected to each other by a rigid adapter 8. Thus, a sufficient natural frequency is provided.

The optical element must be held without redundant constraint in six degrees of freedom so that the optical element can be prevented from being deformed when external heat or force is applied. For example, in the case of holding the optical element at three positions, two degrees of freedom must be constrained at each of the three positions while leaving the remaining four degrees of freedom unconstrained.

However, in the above-described holding apparatus in which the bending members are arranged perpendicular to one another, the rigidity in the twisting direction at each holding section is not sufficiently small. Therefore, the optical element is redundantly constrained. In such a state, deformation caused by disturbance is transmitted to the optical element, which leads to reduction in the optical performance.

SUMMARY OF THE INVENTION

The present invention is directed to a holding apparatus that has a simple structure with high deformation absorbing performance and that reduces deformation of the optical element due to external heat or force.

According to an aspect of the present invention, a holding apparatus that holds an optical element above a base includes three holding units provided at different positions along an outer periphery of the optical element. Each holding unit includes a first member provided on the optical element, a second member provided on the base, a columnar third member extending in a direction perpendicular to both a tangential direction and a radial direction of the optical element, and a plate-shaped fourth member having a thickness in the radial direction of the optical element. The first member and the second member are connected to each other with the third member and the fourth member disposed therebetween.

Further features of the present invention will become apparent from the following description of exemplary embodiments with reference to the attached drawings.

DESCRIPTION OF THE EMBODIMENTS

Embodiments of the present invention will be described with reference to the accompanying drawings.

First Embodiment

Figure 1:
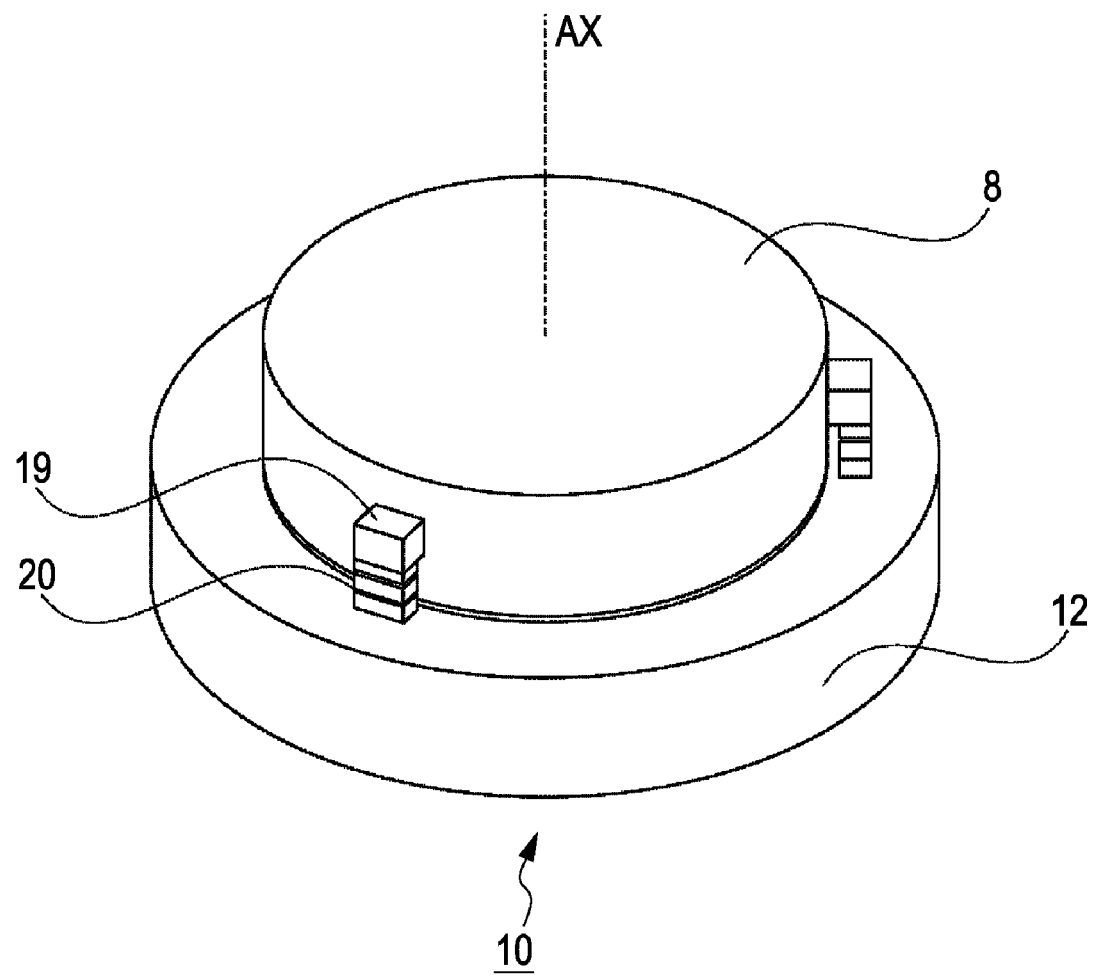
FIG. 1 illustrates an optical element holding apparatus according to a first embodiment of the present invention.

A holding apparatus 10 for holding an optical element will be described with reference to FIG. 1.

The holding apparatus 10 includes three holding portions 20 at three positions along the periphery of an optical element 8. Each of the holding portions 20 is connected to the optical element 8 by a connecting member 19 at one end thereof and is connected to a base 12 at the other end. The connecting member 19 can be made of metal, and is attached to the optical element 8 by adhesion. The connecting member 19 can also be attached by other means. For example, a projection can be formed on the optical element 8 and the connecting member 19 can be attached by engaging the connecting member 19 with the projection.

The base 12 is fastened to a barrel of a projection optical system, which will be described below, and has a rigid structure so as to prevent the optical element 8 from being deformed by an external force. In addition, the base 12 can be made of a low-thermal-expansion material to suppress the influence of heat, and can have a coefficient of thermal expansion that is close to that of the optical element 8. Although the base 12 has a cylindrical shape in the present embodiment, the present invention is not limited to this. For example, the base 12 can also have, for example, a polygonal shape. In addition, an actuator for driving the optical element 8, a sensor for detecting the position of the optical element 8, etc., can be additionally provided.

Figure 2A:
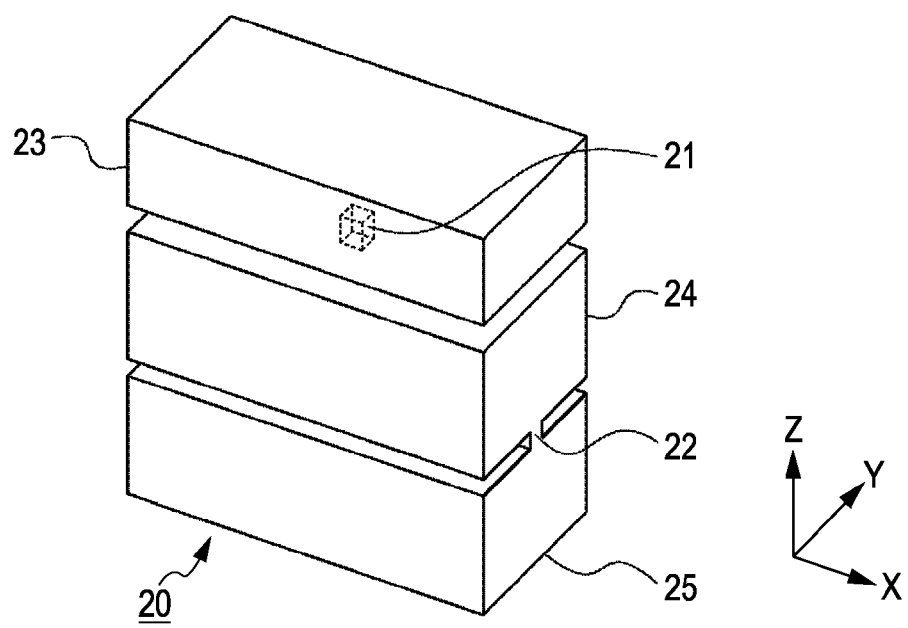
FIGS. 2A, 2B, and 2C illustrate a holding portion according to the first embodiment.
Figure 2B:
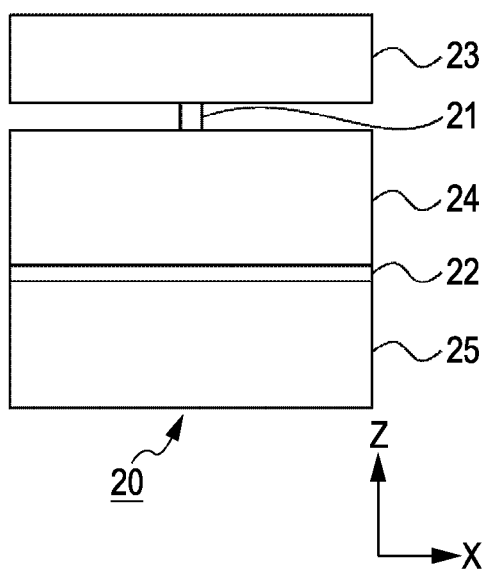
Figure 2C:
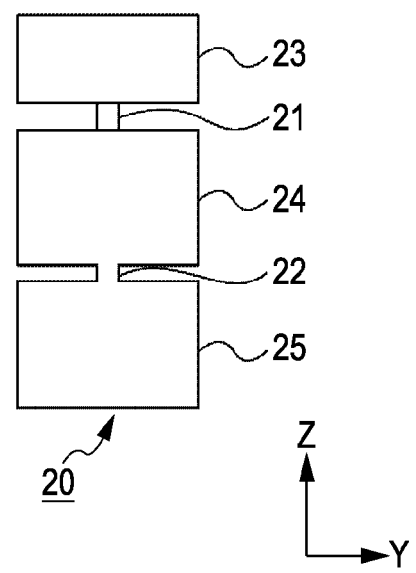

FIGS. 2A, 2B, and 2C are a perspective view, a front view, and a side view, respectively, illustrating the structure of each holding portion 20. In FIGS. 2A, 2B, and 2C, an axis extending in a circumferential direction along the periphery of the optical element 8 is defined as the X-axis, an axis perpendicular to the circumferential direction and connecting the center of gravity of the optical element 8 and a point on the periphery thereof is defined as the Y-axis, and an axis perpendicular to both the X-axis and the Y-axis is defined as the Z-axis.

In the present embodiment, the case in which the optical element 8 has a circular shape and in which an optical axis is perpendicular to an optical surface of the optical element 8 will be described as an example. Therefore, an axis extending in the tangential direction of the circular shape is defined as the X-axis, an axis extending in the radial direction is defined as the Y-axis, and an axis extending along the optical axis is defined as the Z-axis.

The holding portion 20 includes a plate-shaped elastic member 22 (first elastic member) deformable around the X-axis (first axis) and an elastic member 21 (second elastic member) deformable not only around the X-axis but also around the Y-axis (second axis) and the Z-axis. In other words, the elastic member 21 functions as a ball joint (pivot) rotatable in three rotational directions. In the present embodiment, a leaf spring that has a thickness in the Y-axis direction and that extends in the X-axis direction is used as the elastic member 22.

The state in which an object is "deformable" in a certain direction means that the rigidity in that direction is smaller than the rigidities in other directions. With the elastic member 22, the rigidity around the X-axis is smaller than the rigidities in the X-axis direction, the Y-axis direction, the Z-axis direction, and rotational directions around the Y-axis and the Z-axis. Similarly, with the elastic member 21, the rigidities in the rotational directions around the X-axis, the Y-axis, and the Z-axis are smaller than the rigidities in the X-axis direction, the Y-axis direction, and the Z-axis direction.

The holding portion 20 includes three blocks 23, 24, and 25. The block 23 serves to connect either the connecting member 19 or the optical element 8 with the elastic member 21. The block 24 serves to connect the elastic member 21 with the elastic member 22, and the block 25 serves to connect the elastic member 22 with the base 12. Thus, the elastic member 21 and the elastic member 22 are connected to each other. Each block has sufficient thickness and is used as a rigid body.

The above-described blocks 23, 24, and 25 and the elastic members 21 and 22 may be formed integrally with each other, or be formed separately and then connected together by pressure bonding, welding, screw-fastening, force fitting, etc.

The elastic members 21 and 22 are both deformable around the X-axis. Therefore, the holding portion 20 is deformable in the Y-axis direction. In other words, the holding portion 20 can regulate the position of the optical element 8 in the X-axis direction and the Z-axis direction wile absorbing deformation in the directions around the X-axis, Y-axis, and Z-axis and in the Y-axis direction.

Since three holding portions 20 are provided in total, the optical element 8 can be held in six degrees of freedom without excessive constraint by regulating the position of the optical element 8 in two directions at each of the holding portions 20. More specifically, the optical element 8 can be kinematically held, so that the optical element 8 does not easily receive the influence of disturbance from the environment.

Although the elastic member 21 has a quadratic prism shape in FIGS. 2A, 2B, and 2C, the elastic member 21 may also have other shapes, such as columnar or other polygonal prisms.

The optical element holding apparatus having the above-described holding portions has a simple structure with high deformation absorbing performance, and deformation of the optical element due to external heat or force can be suppressed, thereby suppressing the increase of aberrations.

In general, in holding apparatuses holding an object using balls together with V-grooves or conical recesses, fastening force at connecting portions must be increased to obtain a high natural frequency. However, if the fastening force is increased, friction is also increased and degrees of freedom which are not intended to be constrained will become constrained. As a result, the object cannot be kinematically constrained. In comparison, the holding apparatus including the elastic members as described in the present embodiment can kinematically hold an object irrespective of the amount of fastening force, and a high natural frequency can be maintained.

In addition, since the elastic members are connected to each other with a block, the amount of deformation is small in areas other than joints (portions that function as joints) and high rigidity can be obtained. The blocks can have a substantially rectangular prism shape because they can be easily manufactured in such a case.

The blocks and the elastic members can also be formed integrally with each other. In such a case, number of fastening elements, such as bolts, can be reduced and the rigidity can be increased. In addition, the processing accuracy can be increased and the number of components can be reduced.

First Modification

Figure 3A:
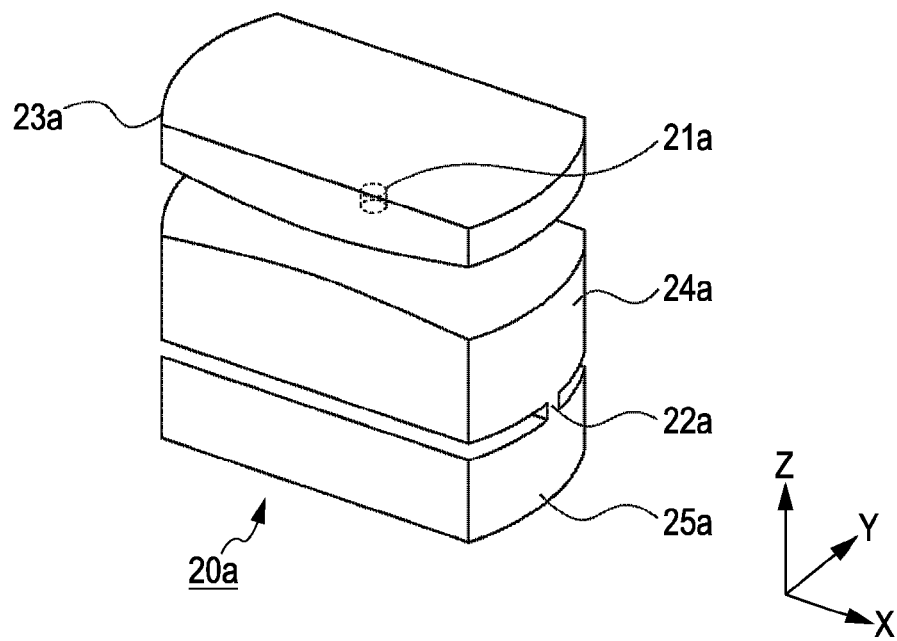
FIGS. 3A, 3B, and 3C illustrate a holding portion according to a first modification of the first embodiment.
Figure 3B:
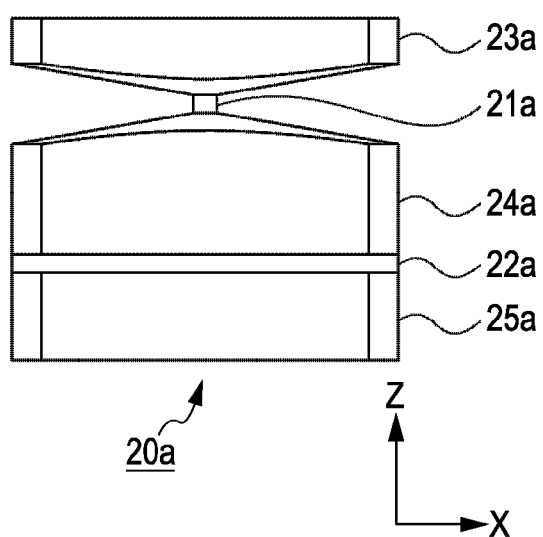
Figure 3C:
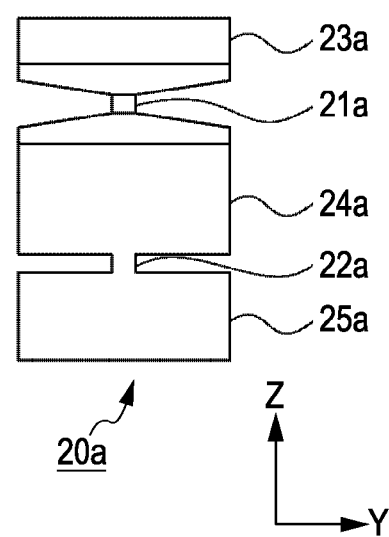

FIGS. 3A to 3C illustrate a first modification of the first embodiment. FIGS. 3A, 3B, and 3C are a perspective view, a front view, and a side view, respectively, illustrating the structure of a holding portion 20a. Components similar to those shown in FIGS. 2A to 2C are denoted by the same reference numerals with the suffix 'a'.

In this modification, an elastic member 21a has a columnar shape. In addition, blocks 23a, 24a, and 25a have curved surfaces. This shape is formed when a single block is processed using a lathe while turning the block around an axis extending along an optical axis. An elastic member 22a is formed by wire cutting.

Second Modification

Figure 4A:
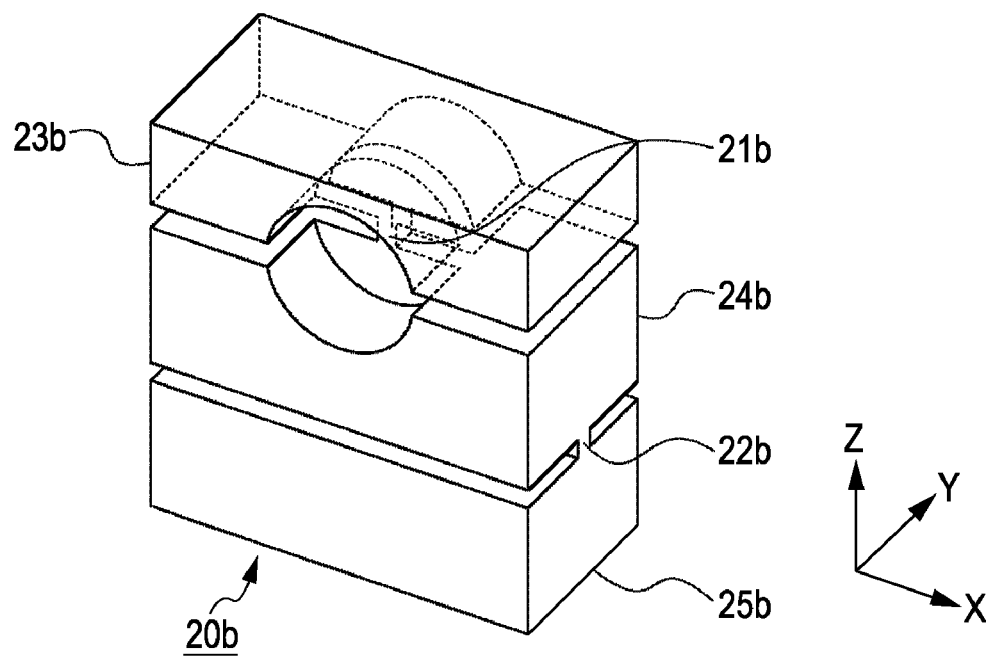
FIGS. 4A, 4B, and 4C illustrate a holding portion according to a second modification of the first embodiment.
Figure 4B:
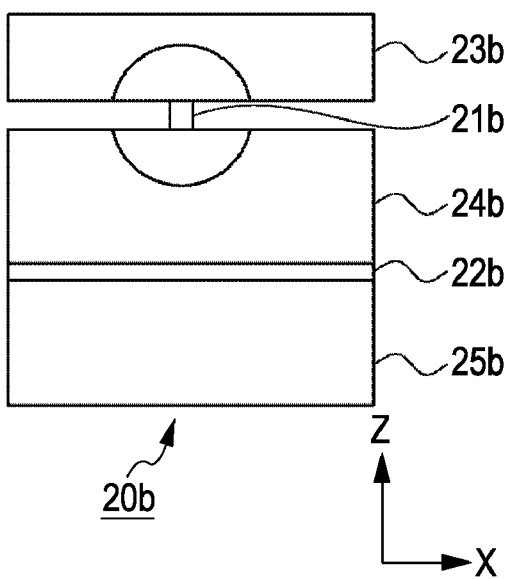
Figure 4C:
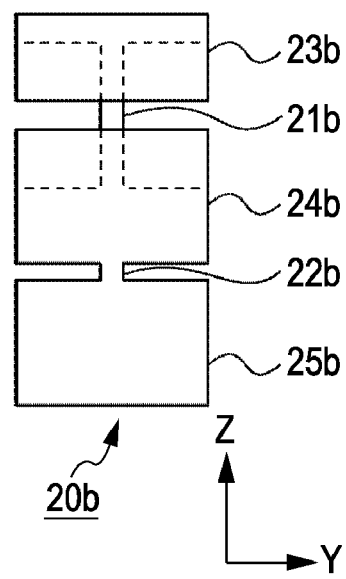

FIGS. 4A to 4C illustrate a second modification of the first embodiment. FIGS. 4A, 4B, and 4C are a perspective view, a front view, and a side view, respectively, illustrating the structure of a holding portion 20b. Components corresponding to those shown in FIGS. 2A to 2C are denoted by the same reference numerals with the suffix 'b'.

The shape shown in FIGS. 4A to 4C is formed when the holding portion 20b is formed using an end mill or by electro-discharge machining.

An elastic member 21b is formed between blocks 23b and 24b by drilling columnar holes into surfaces in the Y-axis direction by an end mill and then performing wire cutting. An elastic member 22b is formed between the block 24b and a block 25b by wire cutting.

As described in the first and second modifications, various methods for forming the holding portion can be used to reduce the number of processes. Although holding portions having different shapes can be obtained depending on the forming methods, effects similar to those described in the first embodiment can be obtained.

Third Modification

Figure 5:
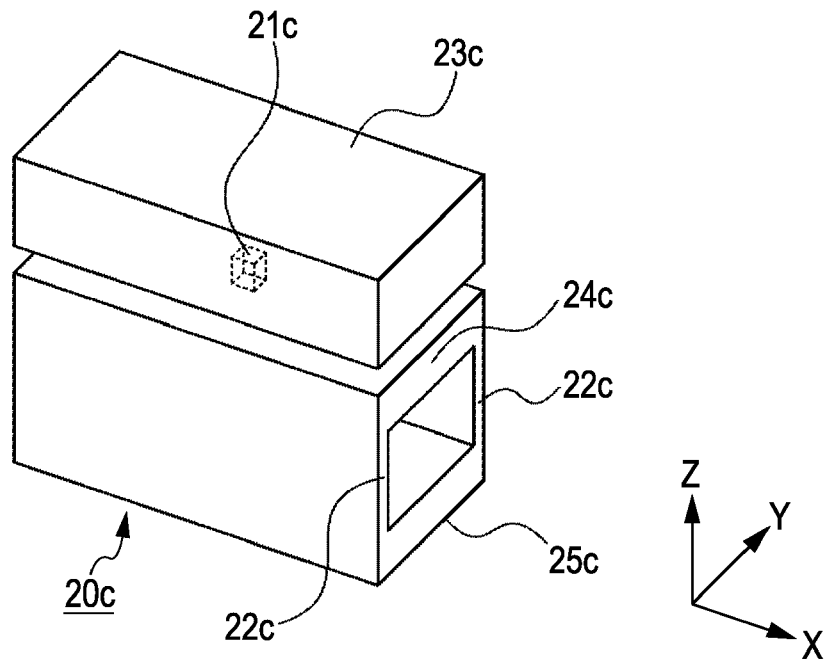
FIG. 5 illustrates a holding portion according to a third modification of the first embodiment.

FIG. 5 illustrates a third modification of the first embodiment. FIG. 5 is a perspective view of a holding portion 20c. Components corresponding to those shown in FIGS. 2A to 2C are denoted by the same reference numerals with the suffix 'c'.

In this modification, two elastic members 22c are provided in place of the elastic member 22 shown FIGS. 2A, 2B, and 2C. An elastic member 21c and blocks 23c, 24c, and 25c are similar to the corresponding components described in the first embodiment. Each of the elastic members 22c are deformable around the X-axis, and are therefore also deformable in the Y-axis direction.

Fourth Modification

Figure 6:
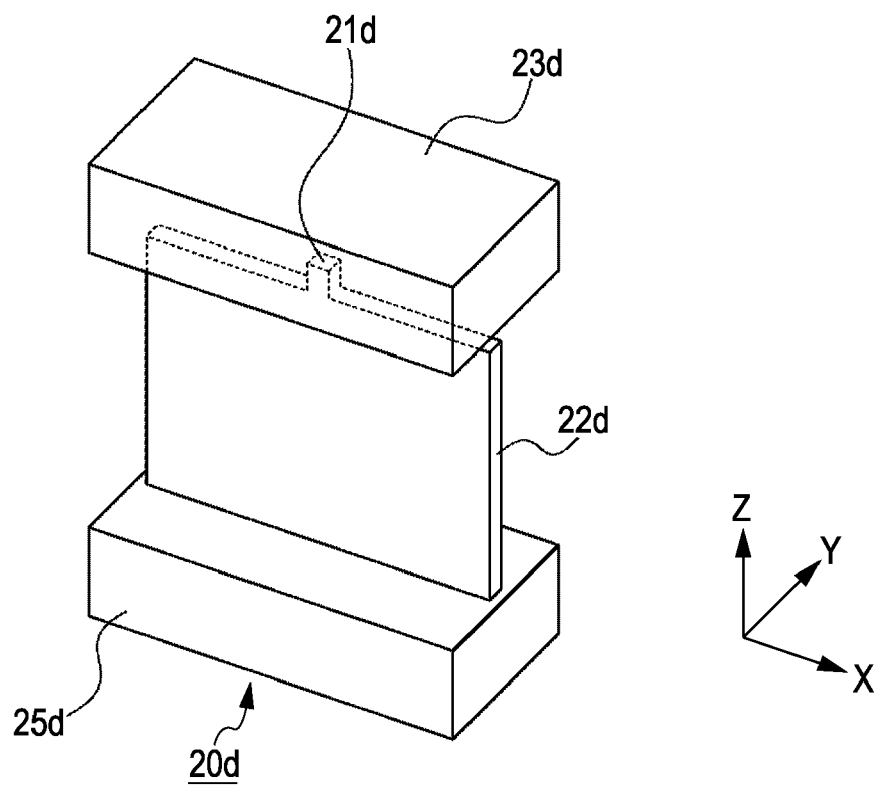
FIG. 6 illustrates a holding unit according to a fourth modification of the first embodiment.

FIG. 6 illustrates a fourth modification of the first embodiment. FIG. 6 is a perspective view of a holding portion 20d. Components corresponding to those shown in FIGS. 2A to 2C are denoted by the same reference numerals with the suffix 'd'.

In this modification, no component corresponding to the block 24 shown in FIGS. 2A, 2B, and 2C is provided, and elastic members 21d and 22d are directly connected to each other. A block 23d is provided between either the optical element 8 or the connecting member 19 and the elastic member 21d, and a block 25d is connected between an elastic member 22d and the base 12.

Thus, the size and weight of the structure can be reduced by directly connecting the elastic members 21d and 22d to each other.

Fifth Modification

Figure 7:
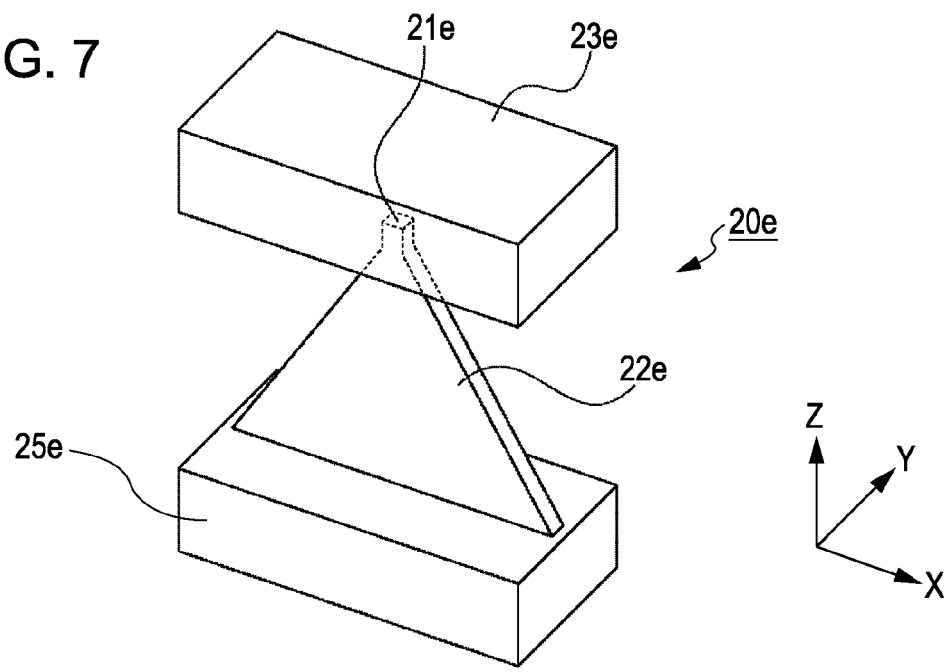
FIG. 7 illustrates a holding portion according to a fifth modification of the first embodiment.

FIG. 7 illustrates a fifth modification of the first embodiment. FIG. 7 is a perspective view of a holding portion 20e. Components corresponding to those shown in FIGS. 2A to 2C are denoted by the same reference numerals with the suffix 'e'.

In this modification, similar to the fourth modification, no component corresponding to the block 24 shown in FIGS. 2A, 2B, and 2C is provided, and elastic members 21e and 22e are directly connected to each other. A block 23e is provided between either the optical element 8 or the connecting member 19 and the elastic member 21e, and a block 25e is connected between an elastic member 22e and the base 12. The fifth modification differs from the fourth modification in that the elastic member 22e has a shape of a triangular plate.

Sixth Modification

Figure 8:
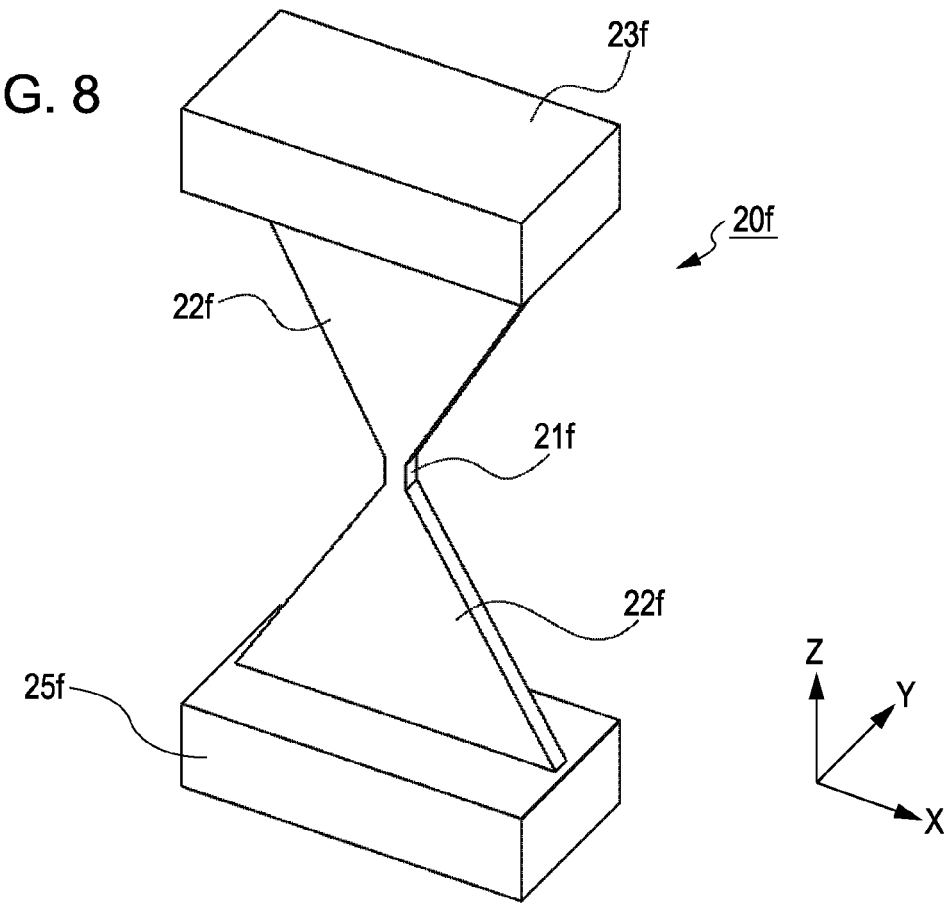
FIG. 8 illustrates a holding portion according to a sixth modification of the first embodiment.

FIG. 8 illustrates a sixth modification of the first embodiment. FIG. 8 is a perspective view of a holding portion 20f. Components corresponding to those shown in FIGS. 2A to 2C are denoted by the same reference numerals with the suffix 'f'.

In this modification, similar to the fourth and fifth modifications, no component corresponding to the block 24 shown in FIGS. 2A, 2B, and 2C is provided and elastic members 21f and 22f are directly connected to each other. The sixth modification differs from the fifth modification in that two elastic members 22f having a rectangular plate shape are provided, and an elastic member 21f is directly connected between the two elastic members 22f. A block 23f is used to connect the optical element 8 to one of the elastic members 22f, and a block 25f is used to connect the base 12 and the other one of the elastic members 22f.

Second Embodiment

Figure 9A:
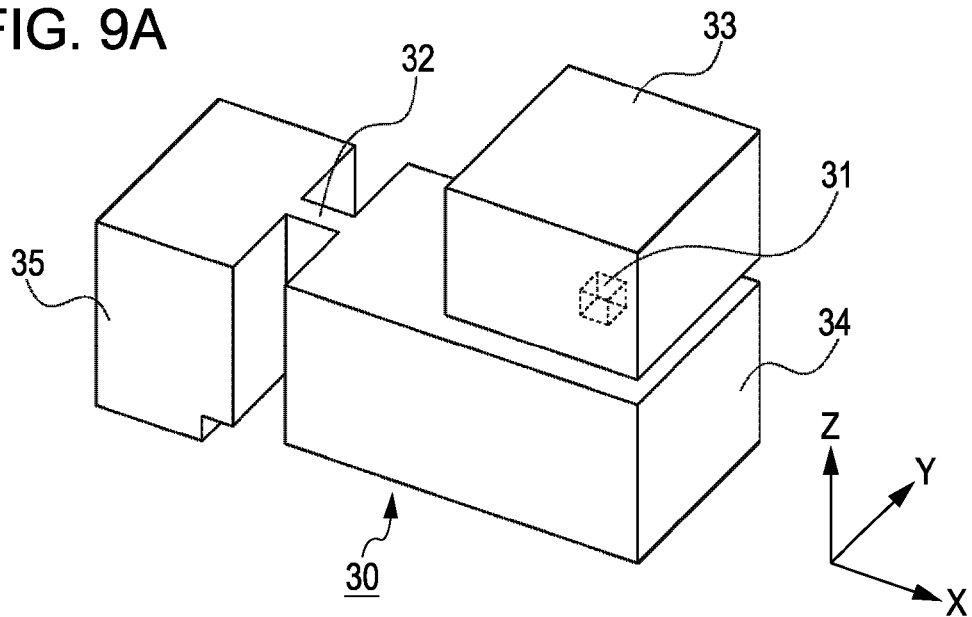
FIGS. 9A, 9B, and 9C illustrate a holding portion according to a second embodiment.
Figure 9B:
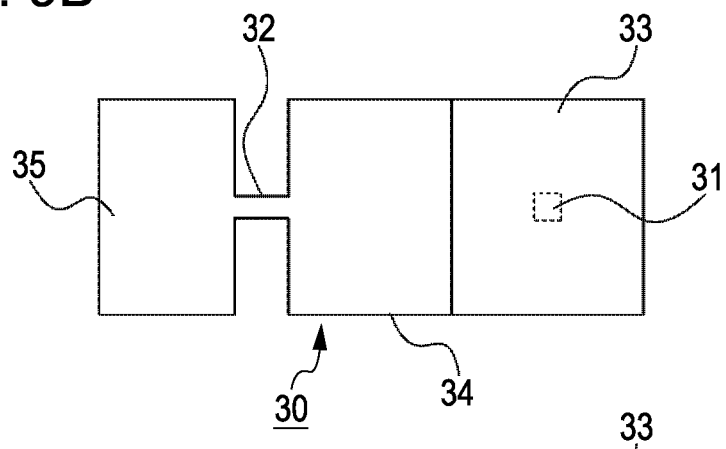
Figure 9C:
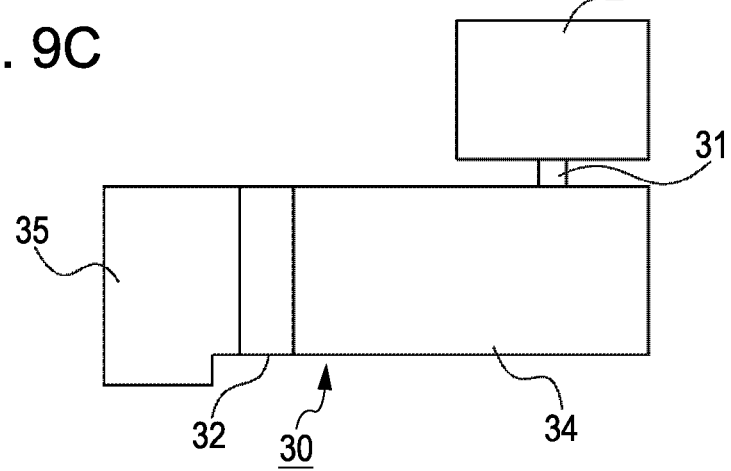

FIGS. 9A to 9C illustrate a holding portion according to a second embodiment. The manner in which the holding portion is disposed is similar to that described with reference to FIGS. 1 and 2A to 2C.

FIGS. 9A, 9B, and 9C are a perspective view, a front view, and a side view, respectively, of a holding portion 30. In the figures, the definitions of the axial directions are similar to those in the first embodiment.

The holding portion 30 includes an elastic member 32 deformable around the Z-axis (first axis) and an elastic member 31 deformable not only around the Z-axis but also around the X-axis (second axis) and the Y-axis (third axis). In other words, the elastic member 31 functions as a ball joint (pivot) rotatable in three rotational directions. In the present embodiment, the elastic member 32 has a thickness in the Y-axis direction and extends in the Z-axis direction.

The holding portion 30 includes three blocks 33, 34, and 35. The block 33 serves to connect the optical element 8 with the elastic member 31. The block 34 serves to connect the elastic member 31 with the elastic member 32, and the block 35 serves to connect the elastic member 32 with the base 12.

The above-described blocks 33, 34, and 35 and the elastic members 31 and 32 may be formed integrally with each other, or be formed separately and then connected together by pressure bonding, welding, screw-fastening, force fitting, etc.

The elastic members 31 and 32 are both deformable around the X-axis. Therefore, the holding portion 30 is deformable in the Y-axis direction. In other words, the holding portion 20 can regulate the position of the optical element 8 in the X-axis direction and the Z-axis direction wile absorbing deformation in the directions around the X-axis, Y-axis, and Z-axis and in the Y-axis direction.

Since three holding portions 30 are provided in total, the optical element 8 can be held in six degrees of freedom without excessive constraint by regulating the position of the optical element 8 in two directions at each of the holding portions 30. More specifically, the optical element 8 can be kinematically held, which reduces the influence of disturbance from the environment.

The above-described modifications of the first embodiment can also be applied to the second embodiment, and similar effects can also be obtained.

Application to Exposure Apparatus

Figure 10:
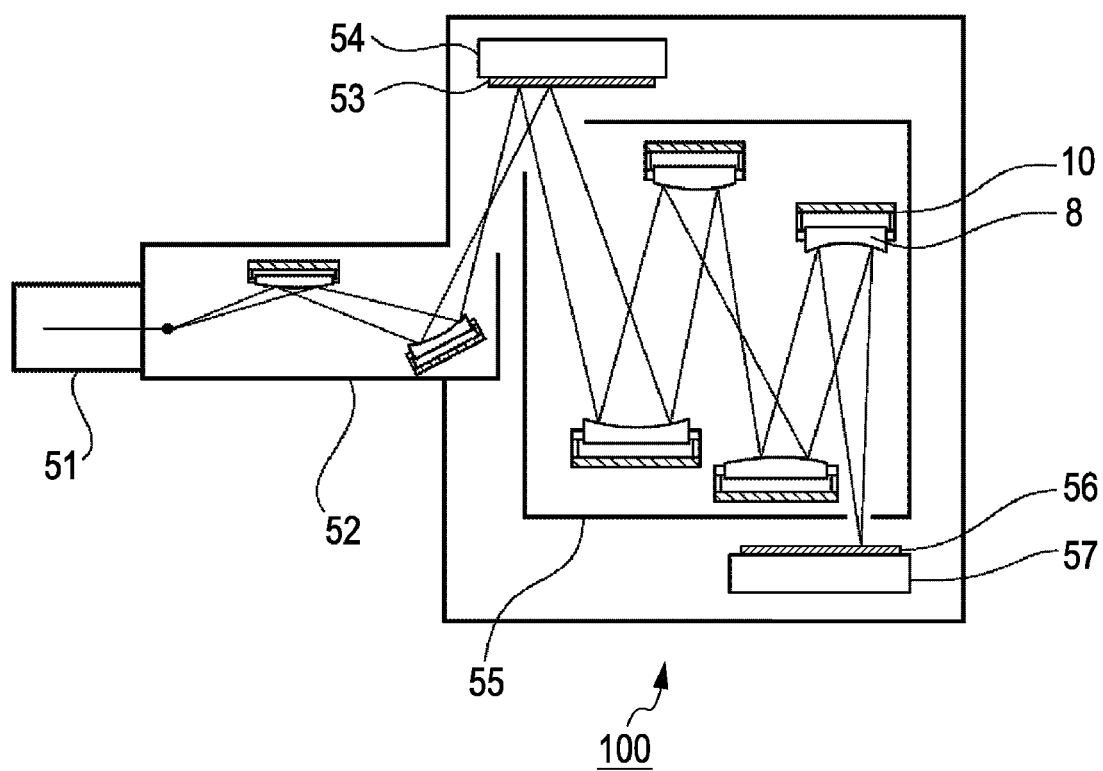
FIG. 10 is a schematic diagram of an exposure apparatus according to an embodiment of the present invention.

FIG. 10 is a schematic diagram of an exposure apparatus 100. The exposure apparatus 100 includes a light source 51, an illumination optical system 52, a reticle stage 54 holding a reticle 53, a projection optical system 55, and a wafer stage 57 for holding a wafer 56.

The light source 51 emits EUV light, and the illumination optical system 52 includes a plurality of mirrors and an aperture stop. The EUV light emitted from the light source 51 is guided to the reticle 53 by the illumination optical system 52.

The EUV light reflected by the reticle 53 is incident on the projection optical system 55. The projection optical system 55 includes a plurality of optical elements 8, and each of the optical elements 8 is held by a holding apparatus identical to the above-described holding apparatus 10. An example in which the optical elements 8 are mirrors will be described. The EUV light incident on the projection optical system 55 is reflected by the optical elements 8 and is incident on the wafer 56. A pattern formed on the reticle 53 is projected onto the wafer 56 after the size thereof is reduced to ¼ or ⅕ by the projection optical system 55. During exposure, the reticle stage 54 and the wafer stage 57 are driven at a velocity ratio that is equal to the size reduction ratio of the projection optical system 55.

In FIG. 10, the projection optical system 55 includes four optical elements 8. However, the present invention is not limited to this, and the projection optical system 55 can also include six or eight optical elements.

In the EUV exposure apparatus that performs exposure at high resolution, the projection optical system is required to have an extremely high accuracy. For example, the allowance of deformation of each mirror is about 1 nm or less. If the optical elements, such as the mirrors, are deformed, the light path is changed due to the deformation. Accordingly, a light ray that is expected to form a point image cannot converge at that point and aberrations will occur. As a result, the image becomes blurred or displaced and short circuits occur in the circuit pattern formed on the wafer. The deformation of each mirror can be prevented and the exposure can be performed with high accuracy by holding each mirror in the EUV exposure apparatus using the above-described optical element holding apparatus.

Example of Device Manufacturing Method

Figure 11:
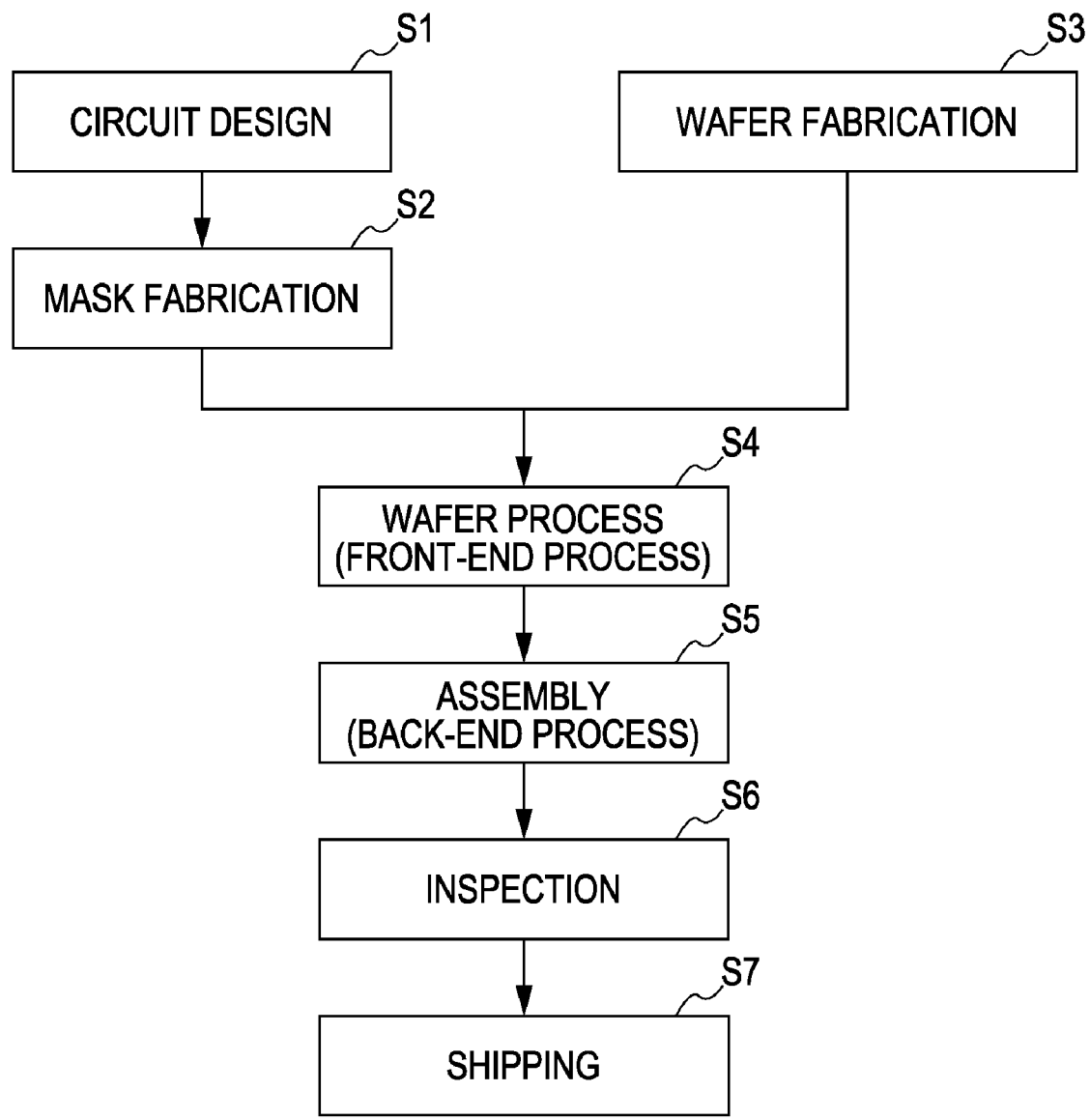
FIG. 11 is a flowchart of a device manufacturing process using the exposure apparatus.

An example of a device manufacturing method using the above-described exposure apparatus will be described below with reference to FIGS. 11 and 12. FIG. 11 is a flowchart showing processes for manufacturing devices (for example, semiconductor chips such as ICs and LSIs, LCDs, and CCDs). In this example, a manufacturing method of semiconductor chips will be described.

In Step S1 (circuit design), a circuit of semiconductor devices is designed. In Step S2 (mask fabrication), a mask is fabricated in the designed circuit pattern. In Step S3 (wafer fabrication), a wafer is formed of a material such as silicon. In Step S4 (wafer process), called a front-end process, actual circuits are formed on the wafer by lithography with the mask and the wafer using the exposure apparatus. In Step S5 (assembly), called a back-end process, semiconductor chips are formed from the wafer obtained in Step S4. This process includes an assembly process (dicing and bonding) and a packaging process (chip sealing). In Step S6 (inspection), the semiconductor devices obtained in Step S5 are tested for, for example, operation and durability. The semiconductor chips are thus completed through the above processes, and are then shipped (Step S7).

Figure 12:
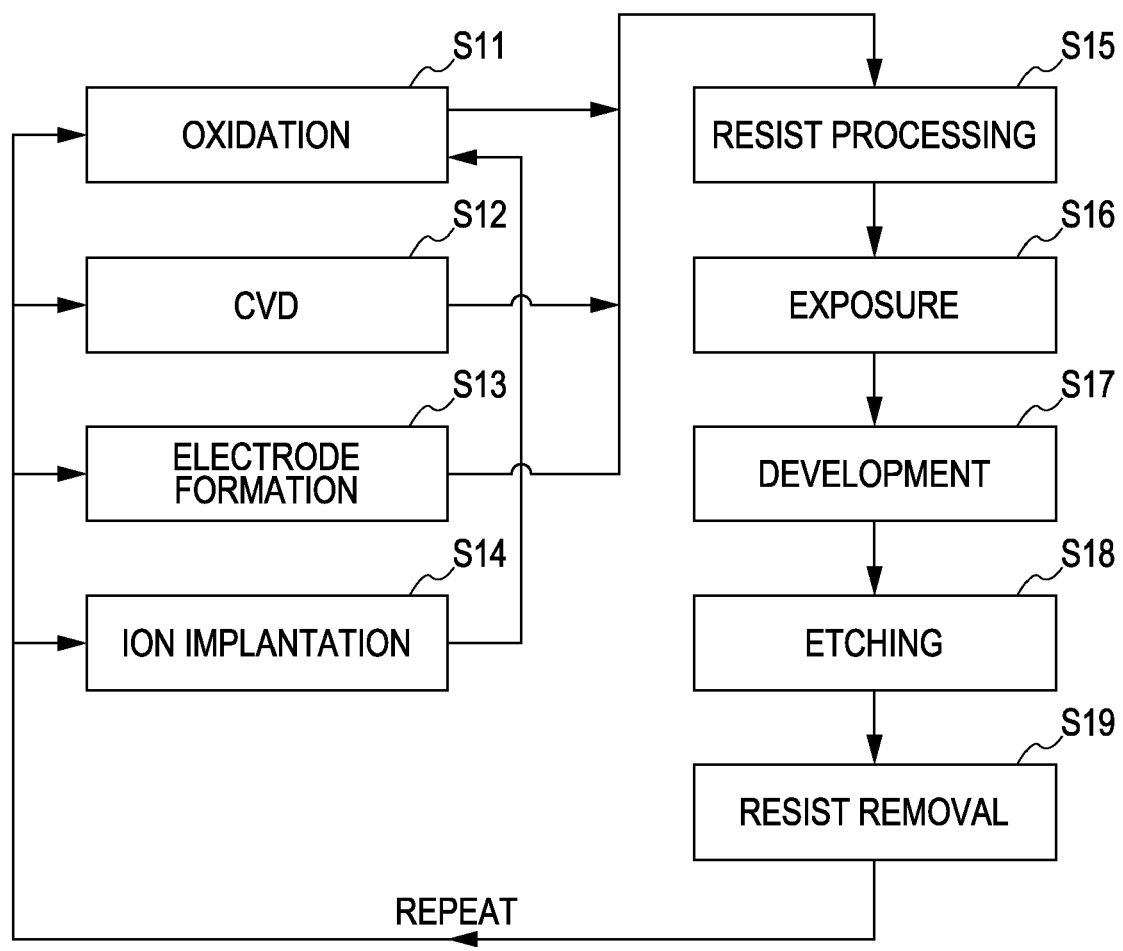
FIG. 12 is a flowchart of a wafer process in step 4 of the flowchart shown in FIG. 11.
Figure 13:
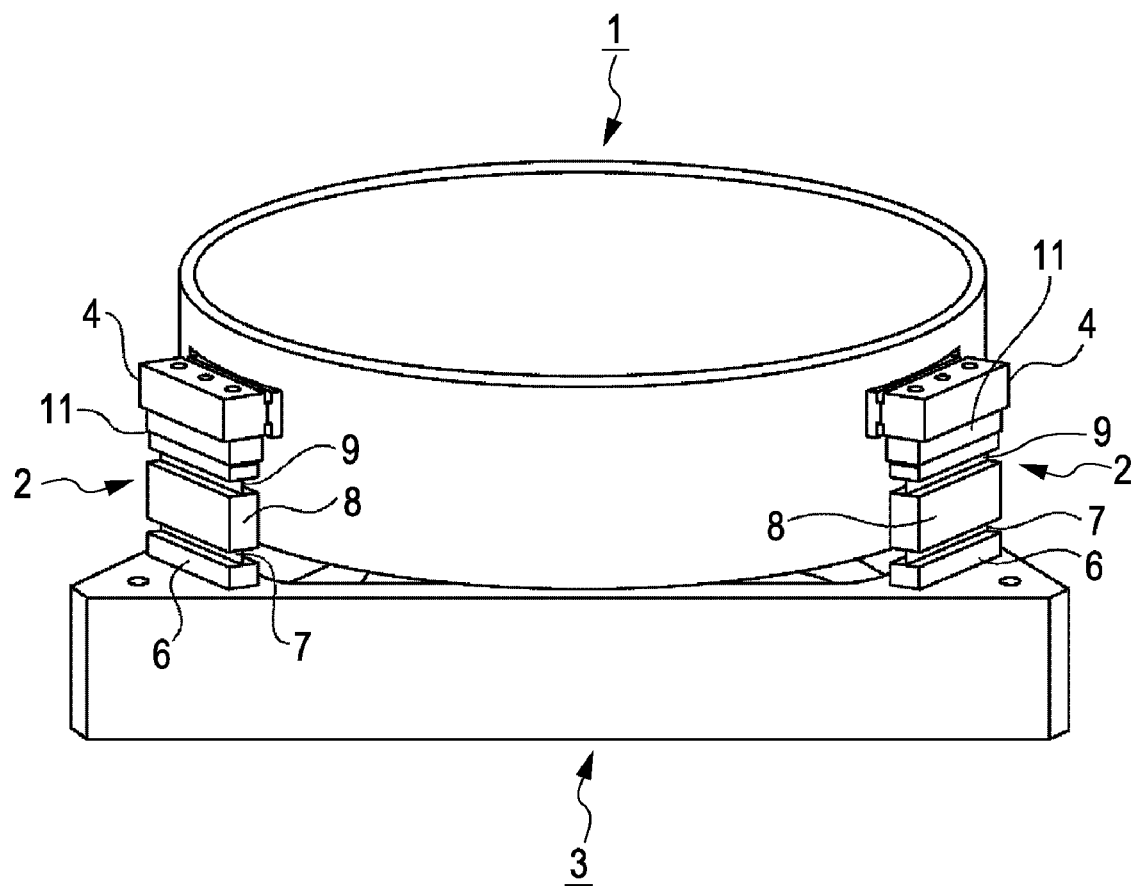
FIG. 13 illustrates a holding apparatus described in Japanese Patent Laid-Open No. 2002-350699.

FIG. 12 is a detailed flowchart of the wafer process performed in Step S4 shown in FIG. 11. In Step S11 (oxidation), the surface of the wafer is oxidized. In Step S12 (CVD), an insulating film is formed on the surface of the wafer. In Step S13 (electrode formation), electrodes are formed on the wafer by deposition. In Step S14 (ion implantation), ions are implanted into the wafer. In Step S15 (resist processing), a photosensitive agent is applied to the wafer. In Step S16 (exposure), the circuit pattern of the mask is projected onto the wafer by the exposure apparatus. In Step S17 (development), the exposed wafer is developed. In Step S18 (etching), parts other than the developed resist image are etched away. In Step S19 (resist removal), the resist, which becomes unnecessary after etching, is removed. By repeating these steps, a multi-layer circuit pattern is formed on the wafer.

Although an EUV exposure apparatus is described as an example in the above explanation, the present invention can also be applied to an exposure apparatus using exposure light other than the EUV light. The present invention can be applied to any kind of apparatuses in which an optical element must be held with high accuracy.

According to the present invention, a simple structure with high deformation absorbing performance can be obtained and deformation of the optical element due to external heat or force can be reduced.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-054105 filed Mar. 5, 2007, which is hereby incorporated by reference herein in its entirety.

What is claimed is:

1. A holding apparatus that holds an optical element above a base, comprising:
   three holding units provided at different positions along an outer periphery of the optical element,
   wherein each holding unit includes:
     a first member provided on the optical element;
     a second member provided on the base;
     a columnar third member extending in a direction perpendicular to both a tangential direction and a radial direction of the optical element; and
     a plate-shaped fourth member having a thickness in the radial direction of the optical element, and
   wherein the first member and the second member are connected to each other with the third member and the fourth member disposed therebetween.

2. The holding apparatus according to claim 1, further including a fifth member configured to connect the third member and the fourth member to each other.

3. A holding apparatus that holds an optical element above a base, comprising:
   three holding units provided at different positions along an outer periphery of the optical element,
   wherein each holding unit includes:
     a plate-shaped first elastic member deformable around a first axis; and
     a second elastic member connected to the first elastic member and deformable around the first axis, a second axis perpendicular to the first axis, and a third axis perpendicular to both the first axis and the second axis.

4. The holding apparatus according to claim 3, wherein the first axis is parallel to a circumferential direction of the optical element.

5. The holding apparatus according to claim 3, wherein the first axis is perpendicular to a circumferential direction of the optical element and perpendicular to an axial direction connecting the center of gravity of the optical element and a point on the outer periphery of the optical element.

6. The holding apparatus according to claim 3, further comprising a connecting member configured to connect the first elastic member and the second elastic member to each other.

7. The holding apparatus according to claim 6, wherein the first elastic member, the second elastic member, and the connecting member are formed integrally with each other.

8. An exposure apparatus for projecting a pattern of an original onto a substrate by exposure through a projection optical system including an optical element, the exposure apparatus comprising:

a holding apparatus holding an optical element above a base and including three holding units provided at different positions along an outer periphery of the optical element, wherein each holding unit includes:

a first member provided on the optical element;

a second member provided on the base;

a columnar third member extending in a direction perpendicular to both a tangential direction and a radial direction of the optical element; and a plate-shaped fourth member having a thickness in the radial direction of the optical element, and wherein the first member and the second member are connected to each other with the third member and the fourth member disposed therebetween.

\* \* \* \* \*